United States Patent [19]

Watanabe et al.

[11] Patent Number: 5,414,389
[45] Date of Patent: May 9, 1995

[54] ATTENUATOR CIRCUIT

[75] Inventors: Takashi Watanabe; Atsushi Saitoh, both of Kanagawa, Japan

[73] Assignee: Mitsumi Electric Co., Ltd., Tokyo, Japan

[21] Appl. No.: 228,703

[22] Filed: Apr. 18, 1994

[30] Foreign Application Priority Data

Apr. 28, 1993 [JP] Japan .................. 5-028003 U
Nov. 30, 1993 [JP] Japan .................. 5-068888 U

[51] Int. Cl.6 ........................................ H03G 3/20
[52] U.S. Cl. ................................. 330/279; 330/284
[58] Field of Search ............. 330/129, 278, 279, 284

[56] References Cited

U.S. PATENT DOCUMENTS 5,101,173  3/1992  DiPiazza et al. ............ 330/284 X
5,208,550  5/1993  Iwane ........................ 330/279 X

*Primary Examiner*—Steven Mottola
*Attorney, Agent, or Firm*—Whitham, Curtis, Whitham & McGinn

[57] ABSTRACT

An attenuator circuit for electrically controlling an amount of attenuation of an input signal, the attenuator circuit includes a main attenuator circuit unit including: a memory device for storing a plurality of amounts of attenuation as parameters; a control circuit for reading one of the parameters from the memory device, to output a control signal according to the parameter being read; a potentiometer having a plurality of control terminals, the potentiometer for providing a control voltage which is varied in steps according to the control signal applied to the control terminals, and an automatic gain control (AGC) amplifier for attenuating an input signal by controlling a gain in response to the control voltage provided by the potentiometer to attenuate an input signal so as to vary the amount of attenuation in steps.

20 Claims, 4 Drawing Sheets

ATTENUATOR CIRCUIT

BACKGROUND OF THE INVENTION

1. Field of the Invention

This invention relates to an attenuator circuit for electrically varying the amount of attenuation of an input signal.

2. Related Art

In general, an attenuator circuit used for a transmitter on the side of the head end (or antenna site) in a two-way community antenna television (CATV) or for a small signal transmitting module such as a communication unit is a π type resistance attenuator which, as shown in FIG. 4(a), is made up of resistors R1, R2 and R3, or a circuit as shown in FIG. 4(b) in which a signal detector circuit 3 detects the output signal of an amplifier 2, and an automatic gain control (AGC) amplifier 1 controls the output gain according to the detection output of the signal detector circuit 3.

In the case of the circuit shown in FIG. 4(a), the amount of attenuation is fixed. Hence, the circuit suffers from a problem that the amount of attenuation cannot be changed as desired.

In the case of the circuit shown in FIG. 4(b), the amount of attenuation can be changed. However, the circuit is still disadvantageous in that it is high in manufacturing cost because it needs the signal detector circuit made up of a number of circuit elements.

Accordingly, an object of this invention is to eliminate the above-described difficulties accompanying a conventional attenuator circuit. More specifically, an object of the invention is to provide an attenuator circuit which is able to vary the amount of attenuation, and which is low in manufacturing cost.

FIG. 7 shows another example of the attenuator circuit of this type, which is made up of a plurality of π type resistance circuits each comprising resistors R1, R2 and R3, and transistor-transistor logic (TTL) drive circuits for controlling the resistance circuits, respectively. For instance, when it is required to attenuate a signal as much as 30 dB in steps of 1 dB, the attenuator circuit should be so designed that the attenuation is made in five steps, 1 dB, 2 dB, 4 dB, 8 dB and 15 dB, as shown in FIG. 7. The attenuator circuit is high in manufacturing cost.

SUMMARY OF THE INVENTION

Accordingly, an object of this invention is to eliminate the above-described difficulties accompanying a conventional attenuator circuit. More specifically, an object of the invention is to provide an attenuator circuit which is able to vary the amount of attenuation, and which is low in manufacturing cost.

According to an aspect of the present invention an attenuator circuit is provided for electrically controlling an amount of attenuation of an input signal, which comprises: a potentiometer with a plurality of control terminals, the potentiometer providing a control voltage which is varied in steps according to an external control signal applied to the control terminals; and an AGC amplifier which is controlled in gain by the control voltage provided by the potentiometer, to attenuate an input signal applied thereto, wherein the amount of attenuation by the AGC amplifier is varied in steps according to the control voltage provided by the potentiometer.

According to another aspect of the present invention an attenuator circuit for electrically controlling the amount of attenuation of an input signal is provided according to the invention which comprises: a first attenuator circuit unit including: a π type attenuator or T type attenuator whose one terminal is connected through a first capacitor to a first signal input terminal, and a TTL drive circuit for varying the amount of attenuation of the π type attenuator or T type attenuator in steps according to an external control signal applied thereto; and a second attenuator circuit unit including: a memory device for storing a plurality of amounts of attenuation as parameter; a control circuit for reading one of the parameters from the memory device, to output a control signal according to the parameter thus read; a potentiometer having a plurality of control terminals, the potentiometer providing a control voltage which is varied in steps according to the control signal applied to the control terminals, and an AGC amplifier which is controlled in gain by the control voltage provided by the potentiometer, to attenuate an input signal which is applied thereto through a second capacitor from the other terminal of the π type attenuator or T type attenuator, thereby to vary the amount of attenuation in steps.

In the attenuator circuit of the invention, the potentiometer produces the control voltage according to the external control signal applied to the control terminal, to control the negative gain of the AGC amplifier. As the control signal is varied in steps according to the external control signal, in the AGC amplifier the gain is controlled, and the amount of attenuation is also varied in steps.

DETAILED DESCRIPTION OF THE PREFERRED EMBODIMENTS

Preferred embodiments of the invention will be described with reference to the accompanying drawings in detail.

First Embodiment

Figure 1:
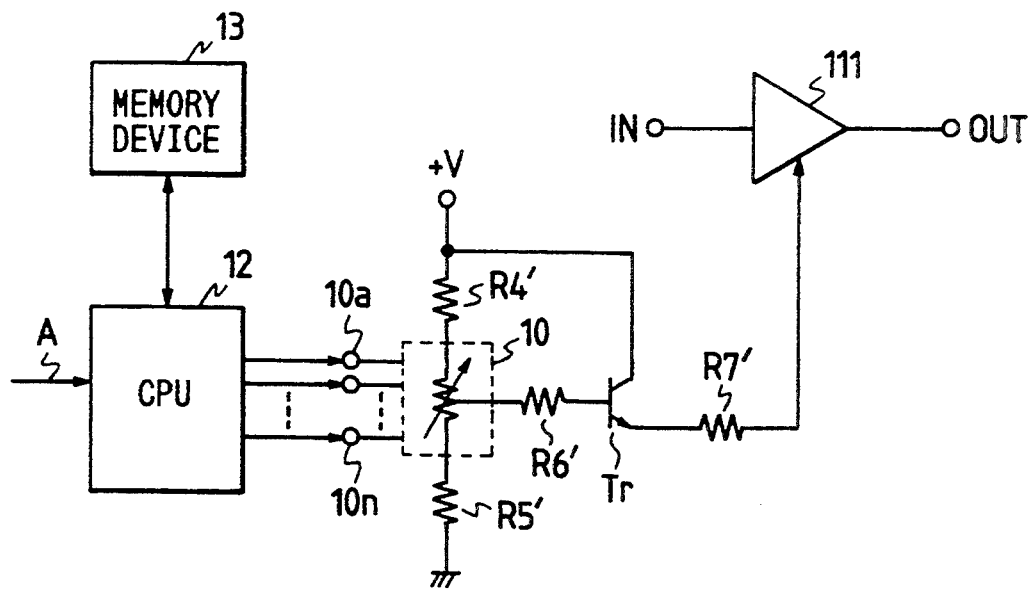
FIG. 1 is a circuit diagram, partly as a block diagram, showing one example of an attenuator circuit, which constitutes a first embodiment of this invention.

An attenuator circuit, which constitutes a first embodiment of the invention, will be described with reference to FIGS. 1 and 2. FIG. 1 is a circuit diagram showing the attenuator circuit, and FIG. 2 is a circuit diagram showing one example of a potentiometer in FIG. 1.

Figure 2:
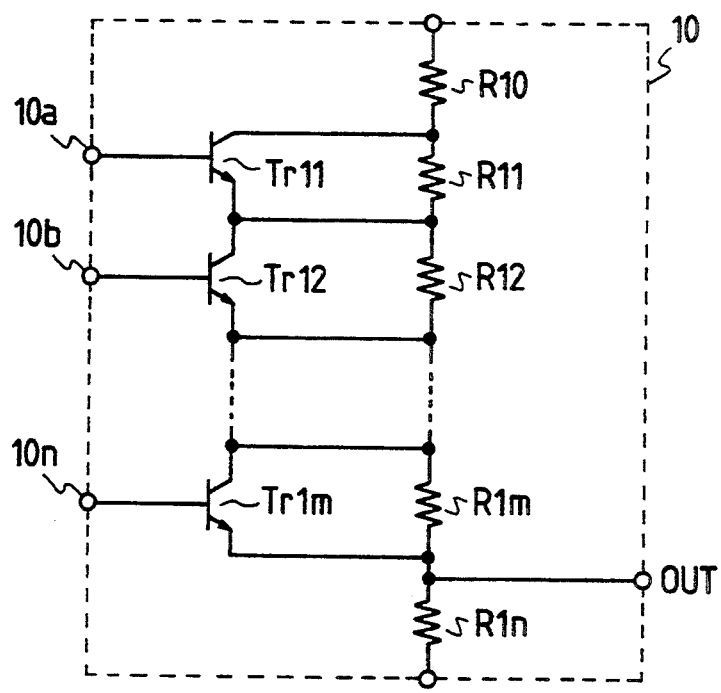
FIG. 2 is a circuit diagram of an example of a potentiometer in the attenuator circuit shown in FIG. 1.

In FIGS. 1 and 2, reference numeral 10 designates a resistance potentiometer having a plurality of control terminals 10a through 10n. Both ends of the potentiometer 10 are connected respectively through resistors R4 and R5 to the power source, and the output voltage of the potentiometer 10 is applied through a resistor R6 to the base of a transistor Tr.

Further in FIG. 1, reference numeral 111 designates an AGC amplifier having a damping characteristic, to which the emitter output of the transistor Tr is applied, as a control voltage, through a resistor R7', to control the amount of attenuation of an input signal; and 12, a CPU (central processing unit) for applying an external control signal consisting of a plurality of bits to the control terminals 10a through 10n of the potentiometer 10; and 13, a memory device for storing, as parameters, a plurality of amounts of attenuation given by the AGC amplifier 111. Those parameters are selectively read out with a parameter control signal A applied to the CPU 12.

The potentiometer 10, as shown in FIG. 2, comprises: a series circuit of the resistors R10 through R1n which are equal in resistance to one another; and transistors Tr11 through Tr1m which shunt the resistors R11 through R1m, respectively. The base electrodes of the transistors Tr11 through Tr1m are connected to the control terminals 10a through 10n, respectively. A control voltage is provided at the connecting point of the resistors R1m and R1n.

The operation of the attenuator circuit thus organized will be described.

In response to the parameter control signal A, the CPU 12 reads one of the parameters from the memory device 13, and, according to the parameter thus read, applies an external control signal for predetermined conditions to the control terminals 10a through 10b of the potentiometer 10. In the potentiometer 10, the transistors (Tr11 through Tr1m) specified by the external control signal are rendered conductive (on) to short-circuit the respective resistors (R10 through R1m), as a result of which the remaining resistors (not short-circuited) and the resistor R1n perform voltage division to output a voltage signal. In this case, by changing the number of resistors (R11 through R1m) to be short-circuited, the output voltage can be varied in equal steps.

Figure 3:
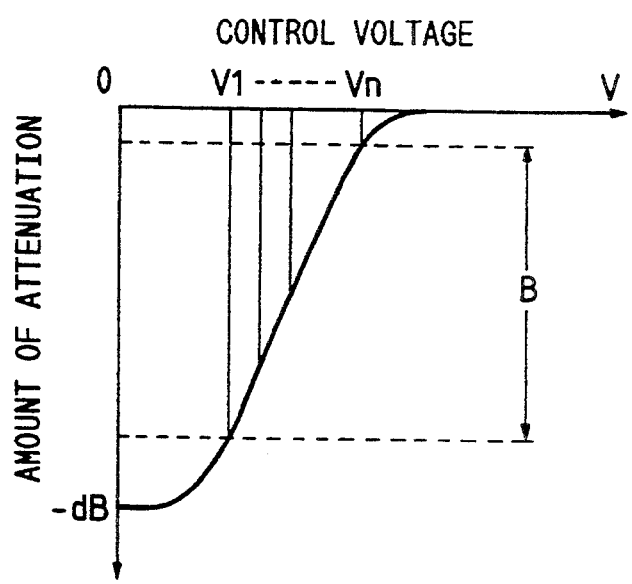
FIG. 3 is a graphical representation indicating the voltage—attenuation characteristic of an AGC amplifier in the attenuator circuit shown in FIG. 1.
Figure 4A:
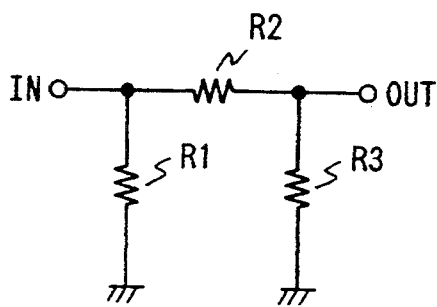
FIG. 4(a) is a circuit diagram showing an example of a conventional attenuator circuit.
Figure 4B:
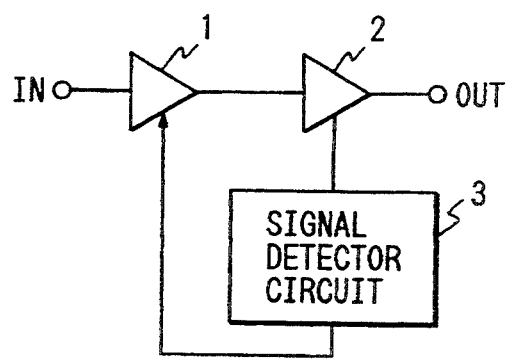
FIG. 4(b) is a block diagram showing another example of the conventional attenuator circuit.

The output voltage of the potentiometer 10 is applied through the resistor R6' to the base of the transistor Tr. The transistor Tr controls the collector-emitter current according to the base voltage, and applies a control voltage through the resistor R7' to the AGC amplifier 111 in proportion to the base voltage. In the AGC amplifier 111, the input signal is attenuated according to the control voltage applied thereto. In this operation, the part B of the characteristic curve of the AGC amplifier shown in FIG. 3 where the amount of attenuation is linearly proportional to the input signal is utilized in combination with the control voltage provided by the potentiometer 10, so that the amount of attenuation is varied in equal steps with the control voltages V1 through Vn.

As is apparent from the above description, by simply modifying a signal transmitting module using a CPU, a step attenuator in which the attenuation is varied in steps can be formed at low cost.

The above-described potentiometer may be of discrete arrangement or of IC arrangement, or it may be of resistor series-connection type or of resistor parallel-connection type. The number of attenuation steps, and the amount of attenuation may be changed by using an amplifier having a damping characteristic which is substantially linear for a high frequency characteristic. The AGC amplifier 11 may be made up of an IC dual gate or PIN diode.

Instead of the potentiometer 10, a D/A (digital-to-analog) converter may be employed. In this case, by dividing the range of voltage of the D/A converter into equal parts, the number of bits of the external control signal can be decreased. An AGC amplifier having a linear characteristic may be intentionally employed. In this case, in order to maintain the AGC amplifier high in accuracy to some extent, it is necessary to design a suitable circuit for it.

In the above-described attenuator circuit of the first embodiment of the present invention, the output voltage of the potentiometer externally controlled is utilized to control the amount of attenuation by the AGC amplifier. The attenuation of the input signal can be varied in steps and at low cost.

In the above-described first embodiment, the AGC amplifier 111 is controlled with the digital potentiometer 10. Therefore, the resultant attenuator circuit is low in manufacturing cost. However, the attenuator circuit suffers from the following difficulties: That is, in the case where an attenuator circuit which is able to perform a linear or distortion-free control operation is formed according to the first embodiment, its maximum amount of attenuation is in a range of 20 to 30 dB. If the amount of attenuation is higher, then the impedance matching of the attenuator circuit is difficult; that is, the attenuator circuit is liable to suffer mis-matching. Thus, the resultant attenuator circuit may have points where appreciable distortion is introduced.

An object of the second embodiment of the present invention is to provide a high-frequency attenuator circuit for providing a large amount of attenuation, 20 to 40 dB, for an input signal while varying it in precise steps of 1 dB, which is free from the above-described difficulties accompanying the attenuator circuit of the first embodiment of the present invention, and which has a linear output characteristic to perform a linear control operation, and which is high in performance and simple in circuit arrangement.

Second Embodiment

Figure 5:
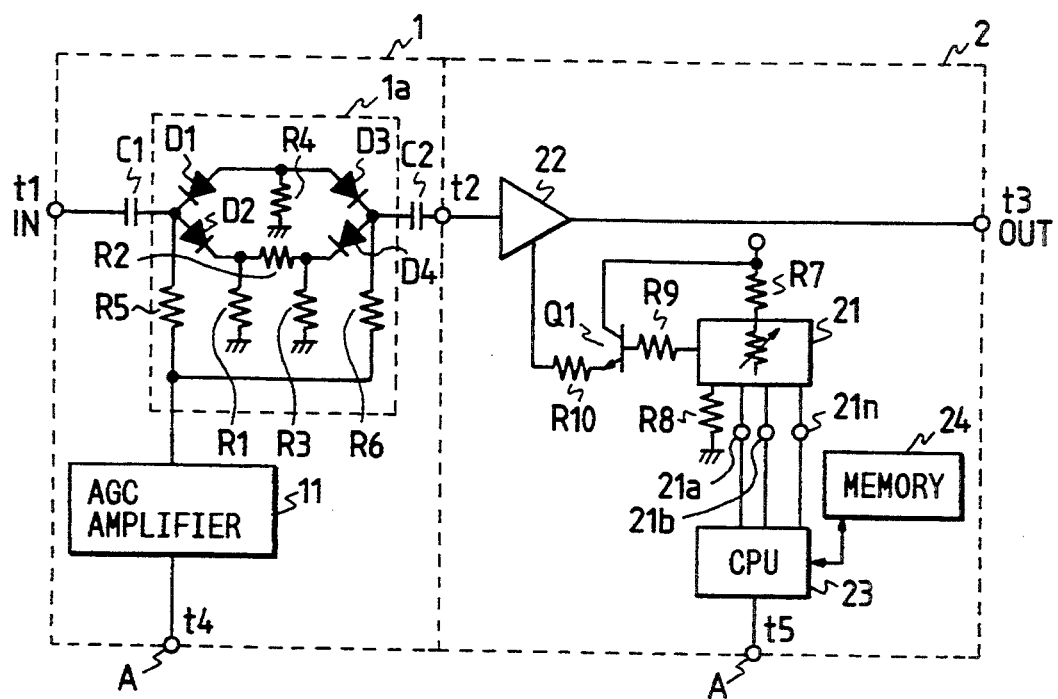
FIG. 5 is a circuit diagram, partly as a block diagram, showing another example of the attenuator circuit, which constitutes a second embodiment of the invention.

FIG. 5 is a circuit diagram showing an attenuator circuit, which constitutes a second embodiment of the invention.

In FIG. 5, reference character t1 designates a signal input terminal (IN); t2, a connecting terminal; t3, a signal output terminal (OUT); and t4 and t5, control signal input terminals.

Further in FIG. 5, reference numeral 1 designates a first attenuator circuit unit; and 2, a second attenuator circuit unit.

The first attenuator circuit unit 1 comprises: a π type attenuator including PIN diodes D1 through D4, and resistors R1 through R6; capacitors C1 and C2 for cutting off DC components; and a TTL drive circuit 11 which renders the PIN diodes D1 through D4 conductive (on) and non-conductive (off) to vary the amount of attenuation in steps of 1 dB. The TTL drive circuit 11 is controlled by a parameter control signal A applied thereto through the control signal input terminal t4, and its control limit is up to 15 dB.

The second attenuator circuit unit 2 comprises: a resistance potentiometer 21 having a plurality of control terminals 21a through 21n; an AGC amplifier 22 having a damping characteristic; a CPU (central processing unit) 23; and a memory device 24. The potentiometer 21 is connected through resistors R7 and R8 to the power source, and its output voltage is applied through a resistor R9 to the base of a transistor Q1. The emitter output of the transistor Q1 is applied through a resistor R10, as a control voltage, to the amplifier 22. In the amplifier 22, the attenuation of the input signal is controlled according to the control signal applied thereto. The CPU 23 is adapted to apply an external control signal of a plurality of bits to the control terminals 21a through 21n of the potentiometer 21. The amounts of attenuation by the AGC amplifier 22 are stored, as parameters, in the memory device 24. The parameters are selectively read from the memory device 24 with a parameter control signal applied to the CPU 23 through the control signal input terminal t4.

Figure 6:
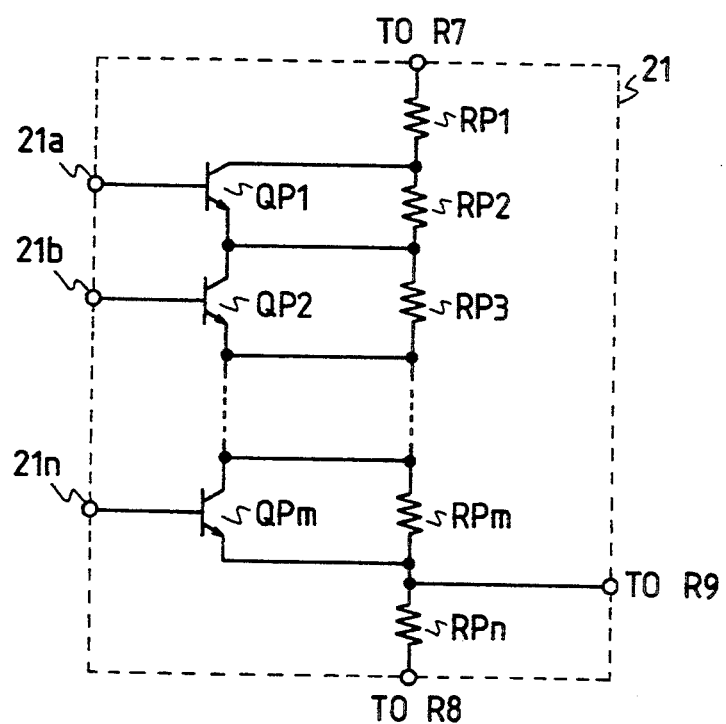
FIG. 6 is a circuit diagram showing an example of a potentiometer in the attenuator circuit shown in FIG. 5.
Figure 7:
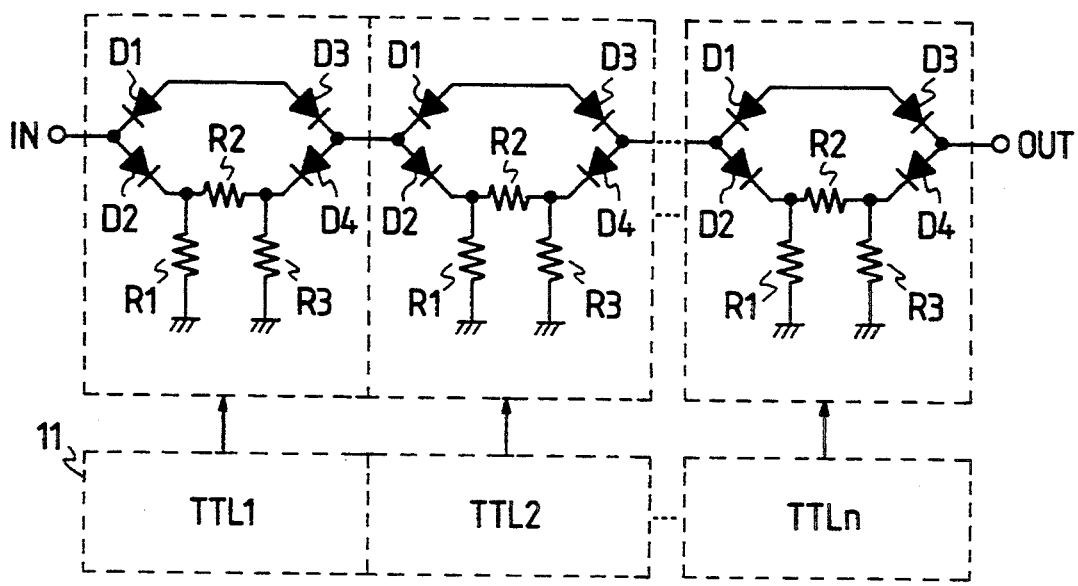
FIG. 7 is a circuit diagram showing another example of the conventional attenuator circuit.

The potentiometer 21, as shown in FIG. 6, comprises: a series circuit of resistors RP1 through RPn which are equal in resistance to one another; and transistors QP1 through QPn shunting the resistors RP1 through RPn, respectively. The bases of the transistors QP1 through QPn are connected to the control terminals 21a through 21n, respectively. A control voltage is provided at the connecting point of the resistors RPm and RPn.

The operation of the attenuator circuit thus organized will be described.

When the parameter control signal A is applied to the control signal input terminals t4 and t5, in the first attenuator circuit unit 1 the TTL drive circuit 11 operates to set the amount of attenuation of π type attenuator 1a to a desired value. At the same time, in the second attenuator circuit unit 2, the CPU 23 reads one of the parameters from the memory device 24 in response to the parameter control signal A, and, according to the parameter thus read, applies an external control signal for predetermined conditions to the control terminals 21a through 21n of the potentiometer 21.

In the potentiometer 21, the transistors (QP1 through QPm) specified by the external control signal are rendered conductive (on) to short-circuit the respective resistors (RP2 through RPm), as a result of which the remaining resistors (not short-circuited) and the resistor RPn perform voltage division to output a voltage signal. In this case, by changing the number of resistors (RP2 through RPm) to be short-circuited, the output voltage can be varied in equal steps.

The output voltage of the potentiometer 21 is applied through the resistor R9 to the base of the transistor Q1. The transistor Q1 controls the collector-emitter current according to the base voltage, and applies a control voltage through the resistor R10 to the AGC amplifier 22 in proportion to the base voltage. In the AGC amplifier 22, the input signal is attenuated according to the control voltage applied thereto. In this operation, the part of the characteristic curve of the AGC amplifier where the attenuation is linearly proportional to the applied voltage is utilized in combination with the control voltage from the potentiometer 21, so that the attenuation is varied in equal steps with the control voltages V1 through Vn.

As is apparent from the above description, by simply modifying a signal transmitting module using a CPU, a step attenuator in which the attenuation of up to 30 dB is varied in steps with no distortion can be formed at low cost.

In the second embodiment, the attenuation is carried out in two steps; that is, the input signal applied through the signal input terminal t1 is attenuated substantially half of the required amount of attenuation by the first attenuator circuit unit, and the signal thus attenuated is applied through the connecting terminal t2 to the second attenuator circuit unit 2, where the attenuation is made as much as the remaining half. For instance in the case where the signal should be attenuated as much as 40 dB as a whole, in the first attenuator circuit unit 1 the signal is attenuated as much as 15 dB, and then in the second attenuator circuit unit 2 it is attenuated as much as 25 dB. That is, in the second attenuator circuit unit 2, the maximum amount of attenuation is 25 dB. Hence, the second attenuator circuit unit 2 has no problem in impedance matching, and therefore the output signal provided at the signal output terminal t3 is free from distortion.

The π type attenuator 1a in the first attenuator circuit unit 1 may be a T type attenuator. The potentiometer 21 in the second attenuator circuit unit 2 may be of discrete arrangement or of IC arrangement, or it may be of resistor series connection type or of resistor parallel-connection type. The number of attenuation steps, and the amount of attenuation may be changed by using an amplifier having a damping characteristic which is substantially linear for a high frequency characteristic. The AGC amplifier 22 may be made up of an IC dual gate or PIN diode. Instead of the potentiometer 10, a D/A (digital-to-analog) converter may be employed. In this case, by dividing the range of voltage of the D/A converter into equal parts, the number of bits of the external control signal can be decreased.

As is apparent from the above description, in the attenuator circuit of the invention, the attenuation is carried out in two steps; that is, the input signal is attenuated substantially half of the required amount of attenuation by the first attenuator circuit unit, and the signal thus attenuated is applied to the second attenuator circuit unit 2, where the signal is attenuated as much as the remaining half. That is, the second attenuator circuit unit attenuates the input signal while operating on the stable part of the impedance matching characteristic. Hence, the output signal provided at the signal output terminal is free from distortion.

In the second attenuator circuit unit, the output voltage of the potentiometer externally controlled is utilized to control the amount of attenuation in the AGC amplifier. Hence, the resultant attenuator circuit is simple in circuit arrangement, low in manufacturing cost, and yet high in performance. Thus, the attenuator circuit of the invention should be highly appreciated in practical use.

What is claimed is:

1. An attenuator circuit for electrically controlling an amount of attenuation of an input signal, the attenuator circuit comprising:
a main attenuator circuit including:
a memory device for storing a plurality of amounts of attenuation corresponding to predetermined parameters;
a control circuit for reading one of the parameters from the memory device to output a control signal according to the parameter being read;
a potentiometer having a plurality of control terminals, the potentiometer for providing a control voltage which is varied in steps according to the control signal applied to the control terminals; and an automatic gain control (AGC) amplifier for attenuating an input signal by controlling a gain in response to the control voltage provided by the potentiometer to attenuate the input signal so as to vary the amount of attenuation in steps, said control circuit being devoid of an output signal from said AGC amplifier.

2. An attenuator circuit for electrically controlling an amount of attenuation of an input signal, the attenuator circuit comprising:

a main attenuator circuit including:
a memory device for storing a plurality of amounts of attenuation corresponding to parameters;
a control circuit for reading one of the parameters from the memory device to output a control signal according to the parameter being read;
a potentiometer having a plurality of control terminals, the potentiometer for providing a control voltage which is varied in steps according to the control signal applied to the control terminals; and
an automatic gain control (AGC) amplifier for attenuating an input signal by controlling a gain in response to the control voltage provided by the potentiometer to attenuate the input signal so as to vary the amount of attenuation in steps; and an auxiliary attenuator circuit including:
an attenuator having a terminal connected through a first capacitor to a first signal input terminal; and
a transistor-transistor logic (TTL) drive circuit for varying the amount of attenuation of the attenuator in steps according to an external control signal applied thereto.

3. An attenuator circuit for electrically controlling an amount of attenuation of an input signal as claimed in claim 2, wherein the attenuator includes one of a $\pi$-type attenuator and a T-type attenuator.

4. An attenuator circuit for electrically controlling an amount of attenuation of an input signal as claimed in claim 2, wherein, the input signal attenuated by the AGC amplifier is inputted from the attenuator through a second capacitor.

5. An attenuator circuit device for electrically controlling an amount of attenuation of an input signal, said attenuator circuit device comprising:

a main attenuator circuit including:
an attenuator having a first terminal connected to a first signal input terminal; and
a drive circuit for varying the amount of attenuation of the attenuator in steps according to an external control signal applied thereto; and an auxiliary attenuator circuit including:
a memory device for storing a plurality of amounts of attenuation corresponding to parameters;
a control circuit for reading one of the parameters from the memory device to output a control signal according to the parameter being read;
means, having a plurality of control terminals, for providing a control voltage which is varied in steps according to the control signal applied to the control terminals; and
an automatic gain control (AGC) amplifier for attenuating an input signal by controlling a gain in response to the control voltage provided by the means for providing to attenuate the input signal which is applied thereto a second terminal of the attenuator so as to vary the amount of attenuation in steps.

6. An attenuator circuit according to claim 1, further comprising an auxiliary attenuator circuit including an attenuator having a first terminal connected to a first signal input terminal.

7. An attenuator circuit according to claim 6, wherein said auxiliary attentuator circuit further comprises a first capacitor, said first terminal of said attenuator being connected through said first capacitor to said first signal input terminal.

8. An attenuator circuit according to claim 7, wherein said auxiliary attenuator circuit further comprises a drive circuit for varying the amount of attenuation of the attenuator in steps according to an external control signal applied thereto.

9. An attenuator circuit according to claim 6, wherein said auxiliary attenuator circuit further comprises a drive circuit for varying the amount of attenuation of the attenuator in steps according to an external control signal applied thereto.

10. An attenuator circuit according to claim 6, wherein, the input signal attenuated by the AGC amplifier is inputted from the attenuator through a second capacitor.

11. An attenuator circuit according to claim 1, wherein said potentiometer includes a plurality of series-connected resistors each having equal resistance to one another.

12. An attenuator circuit according to claim 11, wherein said potentiometer further includes a plurality of transistors for shunting said plurality of resistors.

13. An attenuator circuit according to claim 1, further comprising a resistor coupled between said AGC amplifier and said potentiometer, said control voltage from said potentiometer being applied to said amplifier through said resistor.

14. An attenuator circuit according to claim 1, wherein said AGC amplifier has a damping characteristic which is substantially linear for a predetermined frequency characteristic.

15. An attenuator circuit according to claim 1, further comprising an auxiliary attenuator circuit including an attenuator.

16. An attenuator circuit according to claim 15, wherein said auxiliary attenuator circuit further comprises a drive circuit for varying the amount of attenuation of the attenuator in steps.

17. An attenuator circuit device according to claim 5, further comprising a first capacitor, wherein said terminal of said attenuator is connected through said first capacitor to said first signal input terminal.

18. An attenuator circuit device according to claim 5, wherein said drive circuit comprises a transistor-transistor logic (TTL) drive circuit.

19. An attenuator circuit device according to claim 5, wherein said means for providing comprises a potentiometer.

20. An attenuator circuit device according to claim 5, further comprising a second capacitor, wherein the input signal applied to said AGC amplifier is applied through said second capacitor from said second terminal of the attenuator.

* * * * *